United States Patent

Ohba

[11] Patent Number: 6,071,387
[45] Date of Patent: Jun. 6, 2000

[54] AUTOMATIC PLATING METHOD AND APPARATUS THEREOF

[76] Inventor: Kazuo Ohba, 2-3 Matsubacho 4-chome, Higashimatsuyama-shi, Saitama, Japan

[21] Appl. No.: 09/149,714

[22] Filed: Sep. 9, 1998

[30] Foreign Application Priority Data

Oct. 30, 1997 [JP] Japan ................................. 9-298572
Jun. 30, 1998 [JP] Japan ................................ 10-183914

[51] Int. Cl.⁷ .................................................. C25B 9/00
[52] U.S. Cl. ......................................... 204/275; 118/423
[58] Field of Search .............................. 204/198, 267, 204/275; 118/423

[56] References Cited

U.S. PATENT DOCUMENTS 5,833,816  11/1998  Heermann et al. ..................... 204/198
5,901,997  5/1999   Bayer .................................... 204/198
5,985,123  11/1999  Koon ........................................ 205/96

FOREIGN PATENT DOCUMENTS 10-273799  10/1998  Japan.

Primary Examiner—Kathryn Gorgos
Assistant Examiner—Erica Smith-Hicks
Attorney, Agent, or Firm—Flynn, Thiel, Boutell & Tanis, P.C.

[57] ABSTRACT

An automatic plating method and an apparatus thereof for plating objects to be plated placed upright in a plating tank by moving them continuously in a horizontal direction individually is provided. The method comprises detecting the height of the upper end of each object, and discharging a plating liquid in said plating tank from a hole formed at a height corresponding to the detected height of the upper end of the object out of a plurality of holes formed in the side wall of said plating tank at different heights. At the time of suspension, the plating liquid is discharged up to a position below partition doors and anodes are sunk and kept in the tank having a lowered bottom below the partition doors.

2 Claims, 4 Drawing Sheets

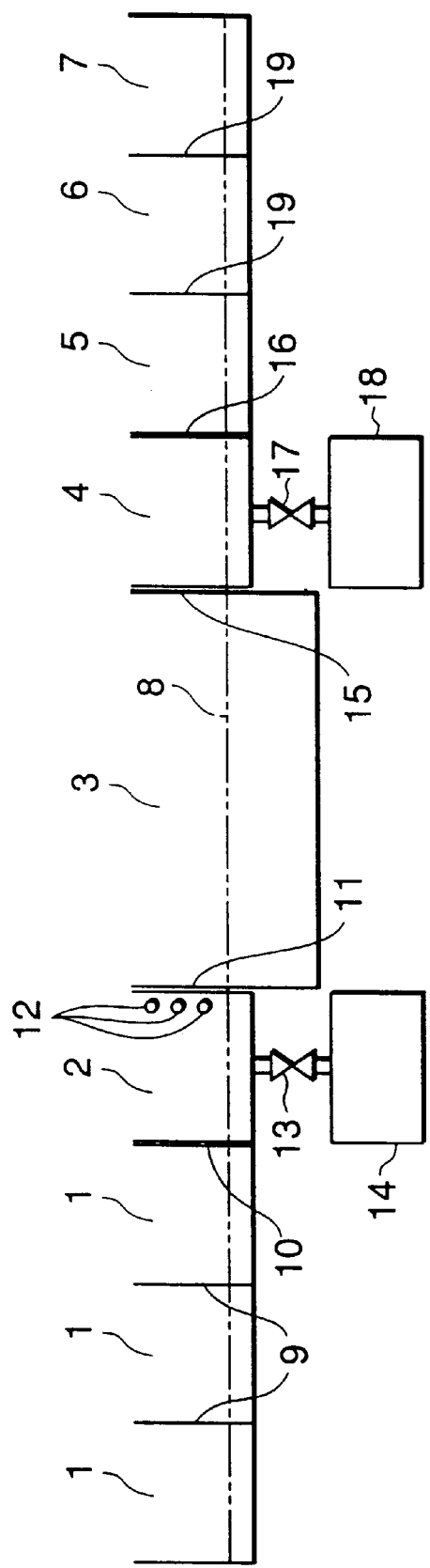

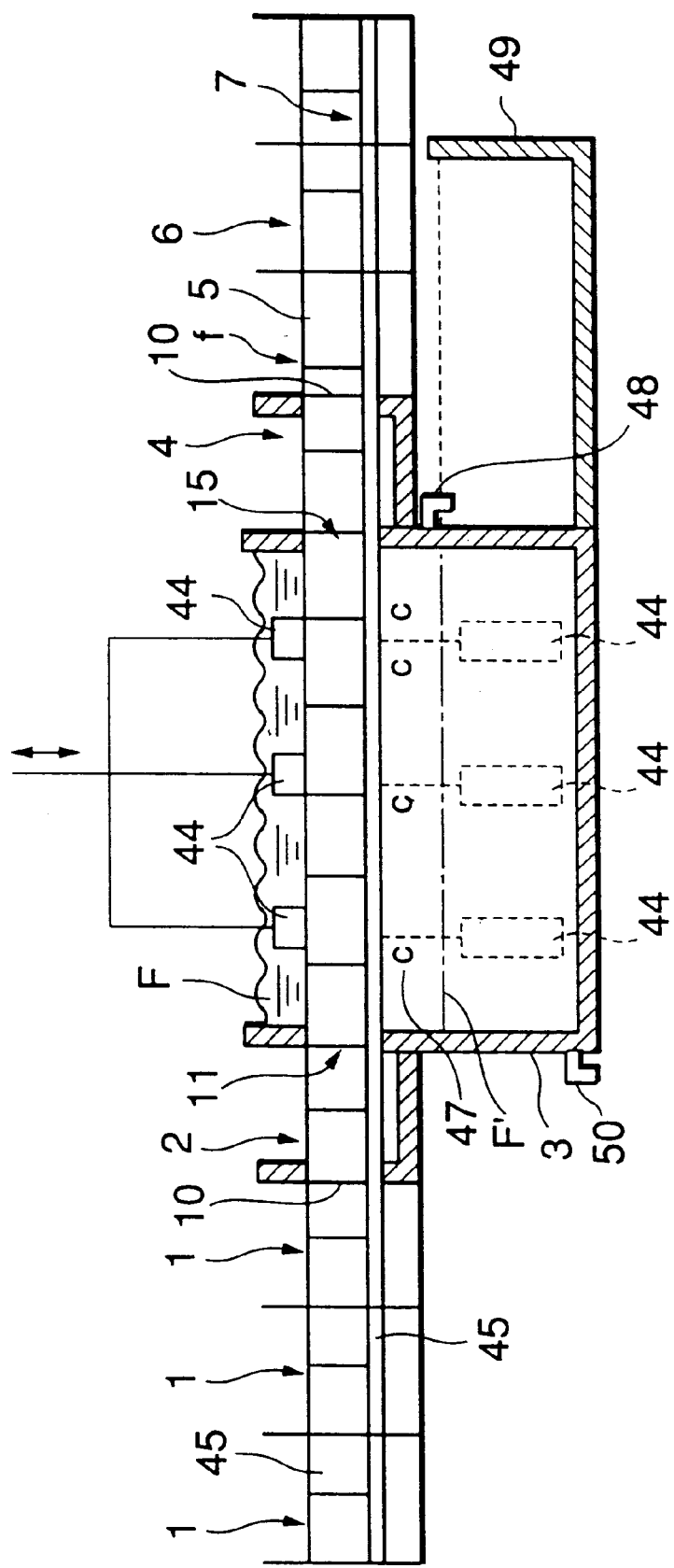

AUTOMATIC PLATING METHOD AND APPARATUS THEREOF

BACKGROUND OF THE INVENTION

1. Field of the Invention

The present invention relates to an automatic plating method and an apparatus thereof for plating an object to be plated automatically.

2. Description of the Related Art

Heretofore, in an automatic plating method for plating an object to be plated (hereinafter referred to as object simply) automatically, plating has been carried out by fixing a plurality of objects to a frame body connected to a cathode by a fixing tool one by one and placing the frame body having the plurality of objects fixed thereto in a plating tank.

However, it takes much time to fix the objects to the frame body one by one and to remove them from the frame body after plating, thereby lowering the efficiency of plating work. Accordingly, an automatic plating method for continuously plating the objects efficiently by moving them in a plating tank continuously in a horizontal direction one by one individually has been proposed in recent years.

However, to shift to a plating work of a group of objects having a different size, the height of the surface of a plating liquid, the positions of electrodes, and the density of current must be adjusted in accordance with the size of the group of objects.

This is because if the height of the surface of the plating liquid is made, for example, 5 cm or more higher than the upper end of the object, current turbulence occurs, thereby deteriorating the plating condition. Further, this is because if the heights of anodes do not corresponds to the height of the object, current turbulence similarly occurs, thereby deteriorating the plating condition.

Further, in case of continuous plating, a liquid sealing device such as a door or a shutter must be provided at the entrance and exit to a plating tank. In addition, the continuous plating is not carried out throughout the year, and must be suspended at night or at the time of maintenance and inspection. When the continuous plating is suspended, it is difficult for the liquid sealing device to perfectly seal up the plating tank because the device is produced on the condition that objects should be let pass therethrough continuously and hence, liquid leakage is inevitable. Therefore, some countermeasure against liquid leakage is required at the time of long-time suspension.

Further, in continuous plating, an air discharge outlet is provided right below a cathode to stir a plating liquid so as to make the composition of the plating liquid uniform. However, foreign matters, decomposed products and the like are produced during long-time plating work and may contact a plating surface by agitation and damage the plating surface.

SUMMARY OF THE INVENTION

The present invention has been made to solve the above problems, and therefore has an object of the present invention to provide an automatic plating method and apparatus thereof in which the height of the upper end of an object to be plated is detected to adjust the height of the surface of a plating liquid in accordance with the height of the upper end of the object and to adjust the heights of anodes in accordance with the height of the object, and the objects are moved in a plating tank continuously in a horizontal direction individually, for carrying out satisfactory plating and for preventing liquid leakage at the time of suspension.

The present invention relates to an automatic plating method for plating objects to be plated placed upright in a plating tank by moving them continuously in a horizontal directly individually, characterized in that the method comprises detecting the height of the upper end of each object, and discharging a plating liquid in the plating tank from a hole formed at a height corresponding to the detected height of the upper end of the object out of a plurality of holes formed in the side wall of the plating tank at different heights. This method makes it possible to carry out satisfactory plating continuously because the height of the surface of the plating liquid in the plating tank corresponds to the height of the upper end of the object.

Further, when the bottom of the tank is lowered to the extent that anodes can be sunk, and the plating liquid can be discharged up to a position near the initial bottom position of the tank, foreign matter, decomposed products and the like produced in the plating liquid settle down on the bottom of the tank and do not exert a bad influence on the plating surface during plating work. During the suspension of the plating work, and the plating liquid is discharged up to a position near the initial bottom position of the tank and kept away from the above-described liquid sealing device to prevent liquid leakage during the suspension of plating work.

The present invention further makes it possible to continuously carry out satisfactory plating by providing anodes in the plating tank through ascending/descending means and adjusting the positions of the anodes in accordance with the height of the object by operating the ascending/descending means to make the heights of the anodes appropriate for the height of the object.

By adjusting the heights of the anodes in accordance with the height of the object during plating work, plating conditions can be set in accordance with the height of each object and a uniform plating film can be always obtained irrespective of the size of the object. During suspension, by lowering the bottom of the plating tank, the surface of the plating liquid can be lowered to a position below a regular work area and the anodes are sunk in the plating liquid in the plating tank below the area to prevent a bad influence from being exerted on a black film formed on the surfaces of the anodes. It is possible to continue the formation of a good plating film even when plating work is resumed.

The present invention also relates to an automatic plating apparatus comprising a plurality of holes formed in at least one side of walls of a plating tank at different heights, respectively, a plurality of plating liquid discharge pipes whose upper ends individually communicate with the above holes and which are individually opened or closed by electromagnetic valves, respectively, moving means for moving objects to be plated placed upright in the plating tank continuously in a horizontally direction individually, detectors for detecting the height of the upper end of each object, and a controller for opening the electromagnetic valve for opening or closing the liquid discharge pipe that communicates with the hole at a height corresponding to the height of the upper end of the object detected by the detector. The electromagnetic valve in accordance with the height of the upper end of the object is opened and the height of the surface of the plating liquid in the plating tank is adjusted in accordance with the height of the upper end of the object, thereby making it possible to carry out satisfactory plating continuously.

In the above respect, the shape of the plurality of holes formed in the side wall of the plating tank at different heights is not particularly limited but is preferably slit-like in a horizontal direction to adjust the surface position of the plating liquid. When circular small holes are formed in a horizontal direction, the strength of the side wall becomes higher than when horizontal slit-like holes are formed.

The present invention further comprises ascending/descending means for adjusting the positions of the anodes provided in the plating tank in a vertical direction and a controller for operating the ascending/descending means in accordance with the height of the upper end of the object detected by the detector and the suspension of plating work. Therefore, the heights of the anodes are adjusted by the ascending/descending means in accordance with the height of the upper end of the object detected by the detector and the suspension of plating work, thereby making it possible to carry out satisfactory plating.

BRIEF DESCRIPTION OF THE DRAWINGS

The above and other objects of the present invention will become apparent from the following description when taken in connection with the accompanying drawings, in which:

FIG. 3 is a side view showing the outline of an automatic plating line; and

FIG. 4 is a side view showing an automatic plating line according to another embodiment of the present invention.

DETAILED DESCRIPTION OF THE PREFERRED EMBODIMENTS

Figure 1:
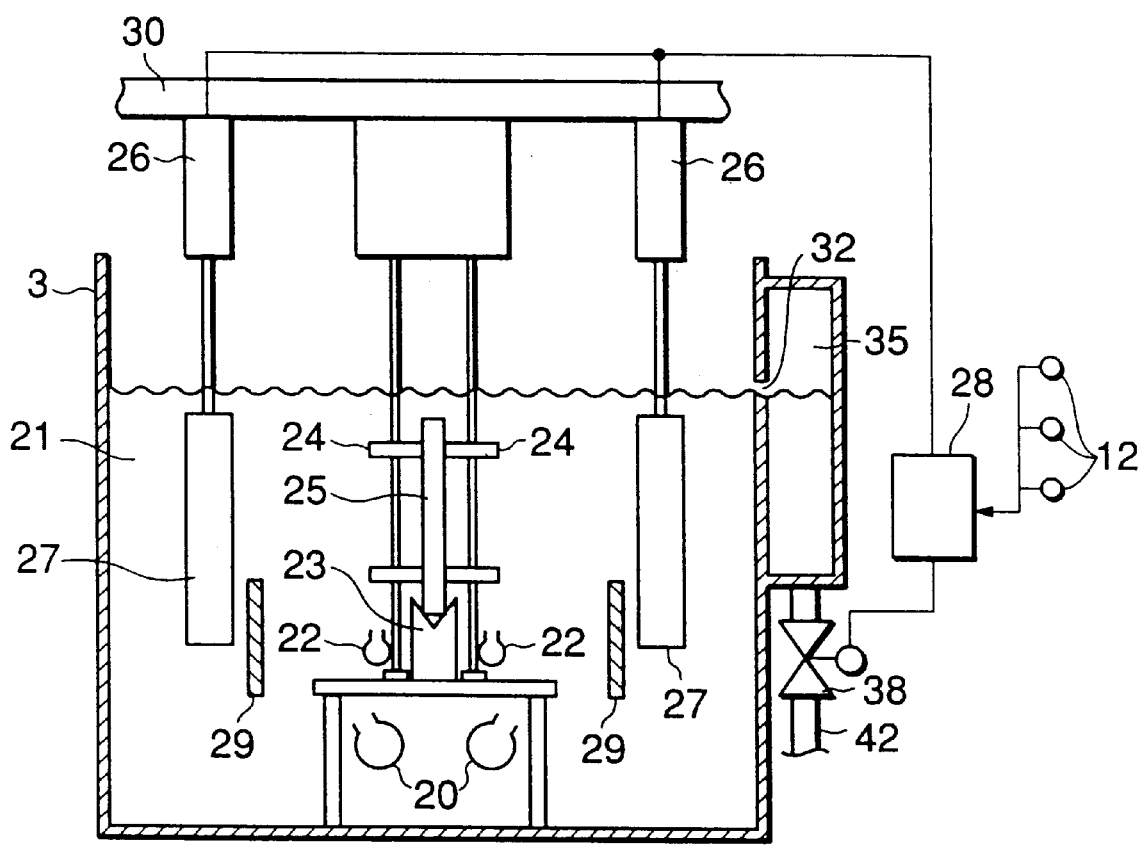
FIG. 1 is a sectional view taken along the line I—I of FIG. 2.

Preferred embodiments of the present invention will now be described with reference to the accompanying drawings.

FIG. 3 is a side view showing the outline of an automatic plating line that is carried out in the present invention. In the line, pretreatment tanks (for degreasing, water washing, activation, and the like) 1, a preliminary plating tank 2, a plating tank 3, a preliminary tank 4, a water washing tank 5, a dehydrating tank 6 and a drying tank 7 are arranged, and moving means 8 for moving objects to be plated (hereinafter referred to as object simply) continuously in a horizontal direction one by one individually along the line of tanks is provided.

A curtain-like partition 9 is provided between the pretreatment tanks 1 and 1 to separate them, a partition door 10 is provided between the pretreatment tank 1 and the preliminary plating tank 2, a partition door 11 is also provided between the preliminary plating tank 2 and the plating tank 3, and detectors 12 for detecting the height of the upper end of the object that has been moved by the moving means 8 in a horizontal direction and placed upright are provided at the entrance side of the partition door 11. A tank 14 is connected to the bottom portion of the preliminary plating tank 2 by a valve 13.

A partition door 15 is provided between the plating tank 3 and the preliminary tank 4, and a partition door 16 is also provided between the preliminary tank 4 and the washing tank 5. A tank 18 is connected to the bottom portion of the preliminary tank 4 by a valve 17. A curtain-like partition 19 is provided between the washing tank 5 and the dehydrating tank 6 and the dehydrating tank 6 and the drying tank 7, respectively, to separate them.

Figure 2:
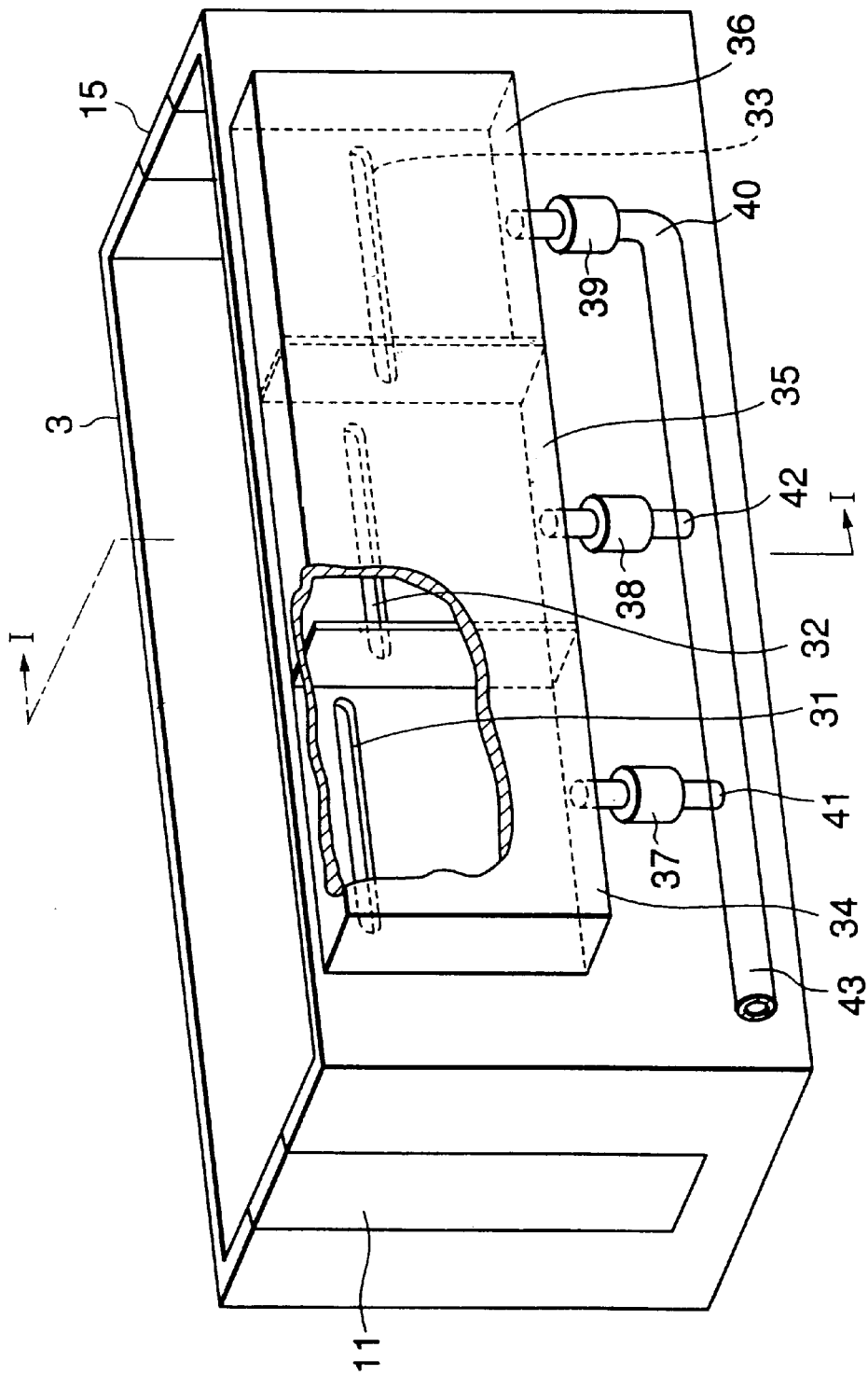
FIG. 2 is a perspective view of a plating tank according to an embodiment of the present invention.

FIG. 1 is a sectional view taken along the line I—I of FIG. 2, and FIG. 2 is a perspective view of the plating tank 3 used in the present invention according to an embodiment of the present invention. As shown in FIG. 1, plating liquid supply pipes 20 are arranged near the bottom portion of the plating tank 3, and a plating liquid 21 is discharged from many discharge ports formed by piercing the walls of the pipes into the plating tank 3 and stirred by air jetted from air discharge pipes 22.

A cradle 23 is provided in a horizontal direction between the partition door 11 and the partition door 15 shown in FIGS. 2 and 3 above the plating liquid supply pipes 20, and many rotary conveyor units 24 are provided along both sides of the cradle 23.

The above cradle 23 and the above rotary conveyor units 24 constitute moving means 8 in the plating tank 3 illustrated in FIG. 3, and the objects 25 are moved in a horizontal direction from the partition door 11 to the partition door 15 continuously one by one individually when the rotary conveyor units 24 contact both sides of the object 25 put on the cradle 23 and rotate.

In the plating tank 3, anodes 27 are inserted by ascending/descending means 26, and the ascending/descending means 26 adjusts the positions of the anodes 27 in a vertical direction in accordance with a control signal from a controller 28 as will be described hereinafter.

In FIG. 1, reference numeral 29 denotes a shielding plate, and numeral 30 denotes a frame work to which the ascending/descending means 26 and a rotary conveyor unit 24 are attached.

As shown in FIG. 2, a plurality of slender holes 31, 32, and 33 are formed by piercing the side wall of the plating tank 3 at different heights. Compartments 34, 35, and 36 that communicate with the plurality of holes 31, 32, and 33 are provided outside the side wall of the plating tank 3, respectively.

The upper ends of plating liquid discharge pipes 40, 41 and 42 which are opened and closed by electromagnetic valves 37, 38, and 39 are individually connected to the bottom portions of the compartments 34, 35, and 36, respectively. The lower ends of the plurality of plating liquid discharge pipes 40, 41, and 42 are connected to a single plating liquid discharge duct 43.

Description is subsequently given of the operation of the above-described apparatus.

First, the partition doors 10 and 11 shown in FIG. 3 are closed, and the valve 13 is opened to empty the preliminary plating tank 2. A group of objects (not shown) are moved in the pretreatment tanks 1, 1, . . . by the moving means 8 continuously in a horizontal direction one by one individually to be cleaned.

An object washed in the final pretreatment tank 1 is moved into the preliminary plating tank 2 by the moving means 8 by opening the partition door 10. When the partition door 11 is opened after the valve 13 is closed as well as the partition door 10 is closed, the plating liquid in the plating tank 3 flows into the preliminary plating tank 2. As a result, the preliminary plating tank 2 is filled with the plating liquid at the same height as that of the plating tank 3.

After the preliminary plating tank 2 is filled with the plating liquid, the object in the preliminary plating tank 2 is moved into the plating tank 3 by the moving means 8. At this point, a detector 12 detects the height of the upper end of the object, and the result is input into the controller 28 shown in FIG. 1.

After the object in the preliminary plating tank 2 is moved into the plating tank 3, the partition door 11 is closed and the valve 13 is opened so that the plating liquid in the preliminary plating tank 2 is discharged into the tank 14. As a result, the preliminary plating tank 2 becomes empty, and the valve 13 is then closed.

The above procedure is repeated to convey the next object washed in the pretreatment tank 1 into the preliminary plating tank 2, fill the preliminary plating tank 2 with the plating liquid, and move the object in the preliminary plating tank 2 into the plating tank 3. Thus, the objects are moved into the plating tank 3 from the preliminary plating tank 2 continuously one by one individually.

As shown in FIG. 1, the objects 25 moved into the plating tank 3 are placed on the cradle 23 in the plating tank 3, which constitutes the moving means 8. The object 25 is then sandwiched between the rotary conveyor units 24, and moved to the partition door 15 (see FIG. 2 and FIG. 3) continuously in a horizontal direction one by one individually to be plated.

As described above, after the object 25 is moved into the plating tank 3 from the preliminary plating tank 2, the partition door 11 is closed. Then, a detection value of the height of the upper end of the object 25 is input from the detector 12 to the controller 28 (described later). Thereafter, the controller 28 selects and opens one of the electromagnetic valves 37, 38, and 39 to discharge the plating liquid 21 therefrom. As a result, the height of the surface of the plating liquid 21 (see FIG. 1) and the positions of the anodes 27 in a vertical direction are adjusted in accordance with the height of the upper end of the object 25.

For instance, when the hole 32, out of the plurality of slender holes 31, 32, and 33 (see FIG. 2) that differ from one another in height, is located at a position ca. 5 cm higher than the upper end of the object 25 that has been moved into the plating tank 3 from the preliminary plating tank 2, the controller 28 opens only the electromagnetic valve 38 of the plating liquid discharge pipe 42 that communicates with the hole 32 through the compartment 35 and keeps the other electromagnetic valves 37 and 39 closed.

Therefore, the plating liquid 21 supplied into the plating tank 3 from the plating liquid supply pipes 20 is discharged into the plating liquid discharge duct 43 through the hole 32, the compartment 35 and the plating liquid discharge pipe 42. As a result, the height of the surface of the plating liquid in the plating tank 3 is kept at the position where the hole 32 is formed by piercing, that is, a position ca. 5 cm higher than the upper end of the object 25.

The controller 28 operates the ascending/descending means 26 as soon as it opens the electromagnetic valve 38 to adjust the positions of the anodes in a vertical direction in accordance with the height of the upper end of the object 25 and control the density of current.

When the upper end of the object 25 moved from the preliminary plating tank 2 into the plating tank 3 is higher than the above position and the hole 31 shown in FIG. 2 is slightly higher than the upper end of the object 25, the controller 28 opens only the electromagnetic valve 37 of the liquid discharge pipe 41, and operates the ascending/descending means 26 to adjust the positions of the anodes 27 in a vertical direction and control the density of current.

Therefore, the plating liquid 21 supplied into the plating tank 3 from the plating liquid supply pipes 20 (see FIG. 1) is discharged into the plating liquid discharge duct 43 through the hole 31, the compartment 34, and the plating liquid discharge pipe 41, the height of the surface of the plating liquid in the plating tank 3 is kept at the height of the hole 33, that is, a position slightly higher than the upper end of the object 25, and the positions of the anodes 27 in a vertical direction is adjusted in accordance with the height of the upper end of the object 25.

When the height of the upper end of the object 25 moved from the preliminary plating tank 2 into the plating tank 3 is low, the controller 28 opens only the electromagnetic valve 39 of the liquid discharge duct 43, and operates the ascending/descending means 26 to adjust the positions of the anodes 27 in a vertical direction and the height of the surface the plating liquid in the plating tank 3 in accordance with the height of the upper end of the object 25.

If the number of the holes 31, 32, and 33 formed by piercing the side wall of the plating tank 3 at different heights is increased, the numbers of the compartments 34, 35, 36 and the electromagnetic valves 37, 38, and 39 are accordingly increased, and the detection range or the number of detection stages of the detector 12 is expanded, the height of the surface of the plating liquid in the plating tank 3 and the positions of the anodes 27 in a vertical direction can be adjusted finely in a wide range.

While the object 25 is plated in the plating tank 3, the valve 13 shown in FIG. 3 is closed, the partition door 16 is closed, the valve 17 is closed, and the partition door 15 is opened to inject the plating liquid 21 (see FIG. 1) into the preliminary tank 4 from the plating tank 3.

When the plated object 25 is moved into the preliminary tank 4 by the moving means 8, the partition door 15 is closed and the valve 17 is opened to discharge the plating liquid 21 in the preliminary tank 4 into the tank 18 to empty the preliminary tank 4.

When the preliminary tank 4 becomes empty, the partition door 16 is opened to move the object 25 into the washing tank 5 from the preliminary tank 4. Thereafter, the valve 17 is closed, the partition door 16 is closed and the partition door 15 is opened to fill the preliminary tank 4 with the plating liquid to the same height as that of the plating liquid in the plating tank 3. Therefore, the next plated object is moved into the preliminary tank 4.

The object moved from the preliminary tank 4 into the washing tank 5 is moved to the dehydrating tank 6 and subsequently moved to the drying tank 7 to be washed with water, dehydrated and dried and taken out as a plated product.

The plating liquid discharged into the tanks 14, 18 (see FIG. 3) and the liquid discharge duct 43 (see FIG. 2) is filtered and supplied again into the plating tank 3 from the plating liquid supply pipes 20.

FIG. 4 shows an automatic plating line according to another embodiment of the present invention. The arrangement of the pre-treatment tanks, plating tank, post-treatment tanks is basically the same as that of FIG. 3. However, the bottom of the plating tank 3 is lowered to cope with the suspension of operation.

The pre-treatment tanks (degreasing, washing, activation, etc.) 1, 1, and 1, the preliminary plating tank 2, the preliminary tank 4 and the post-treatment tanks (washing, neutralizing, dehydrating, drying, etc.) 5, 6, and 7 are arranged successively before and after the plating tank 3. The number of these tanks can be suitably selected. An object 45 is conveyed over a rail 46 by a side roller so that it passes through these tanks continuously. Partition doors 10, 11, 15, and 16 are especially provided at the entrance of the preliminary plating tank 2, the entrance and exit of the plating tank 3 and the exit of the preliminary tank 4, respectively. The surface of the plating liquid in the plating tank 3 is located at F at the time of plating. Plating is carried out by applying electricity to anodes 44 and cathodes (not shown and partly function as a conveyor roller as well) while air is blown out from an air discharge outlet 47 right below the rail 46 to stir the plating liquid. When plating work is suspended, the conveyance of the object 45 is stopped, the anodes 44 are lowered to a position shown by dotted lines of FIG. 4, a pipe 48 is opened to discharge the plating liquid in the plating tank 3 into a preliminary tank 49 and the surface of the plating liquid is lowered to F' in order to prevent liquid leakage from the partition doors 11 and 15. Thereby, the plating liquid is removed from the partition doors 11 and 15, and the possibility of liquid leakage is eliminated. Since the anodes 44 are in the plating liquid at positions shown by dotted lines, a black film is protected. To resume plating, the plating liquid is returned from the preliminary tank 49 to the plating tank 3 to start continuous plating. When foreign matter is produced in the plating liquid and accumulates on the bottom of the tank, the plating liquid containing the foreign matter is discharged from the tank through a pipe 50 and filtered at an appropriate time. The shortage of the plating liquid is filled up as required.

The present invention has an effect that the height of the surface of the plating liquid in the plating tank corresponds the height of the upper end of the object, thereby making it possible to carry out satisfactory plating continuously and efficiently.

The present invention has another effect that the positions of the anodes are adjusted in accordance with the height of the object, thereby making it possible to carry out satisfactory plating continuously without current turbulence.

According to the present invention in which the bottom of the tank is lowered, the plating surface is not stained by foreign matter produced in the plating liquid. Further, a black film formed on the surface of the anode is not affected and maintenance is unnecessary at the time of suspension. Further, plating can be carried out continuously and efficiently.

The present invention has still another effect that the electromagnetic valve of a liquid discharge pipe that communicates with a hole formed at a height corresponding to the height of the upper end of the object detected by the detector to make the height of the surface of the plating liquid in the plating tank correspond to the height of the upper end of the object, thereby making it possible to carry out satisfactory plating continuously and efficiently.

The present invention has a yet still another effect that the positions of the anodes are adjusted by the ascending/descending means in accordance with the height of the upper end of the object detected by the detector, thereby making it possible to carry out satisfactory plating continuously without current turbulence. At the time of suspension of plating work, the plating liquid is discharged up to a position near below the partition doors to prevent liquid leakage during long-time suspension.

What is claimed is:

1. An automatic plating apparatus comprising:
   a plurality of holes formed in at least one of side walls of a plating tank at different heights, respectively;
   a plurality of plating liquid discharge pipes whose upper ends individually communicate with said holes and which are individually opened or closed by electromagnetic valves, respectively;
   moving means for moving objects to be plated placed upright in said plating tank continuously in a horizontally direction individually;
   a plurality of detectors for detecting the height of the upper end of the object; and
   a controller for opening an electromagnetic valve for opening or closing a liquid discharge pipe that communicates with said hole at a height corresponding to the height of the upper end of the object detected by said detectors.

2. The automatic plating apparatus of claim 1 comprising:
   ascending/descending means for adjusting the positions of anodes provided in said plating tank in a vertical direction; and
   a controller for operating the ascending/descending means in accordance with the height of the upper end of the object detected by said detectors and the suspension of plating work.

* * * * *